United States Patent
Taniguchi et al.

(10) Patent No.: US 8,756,777 B2
(45) Date of Patent: Jun. 24, 2014

(54) METHOD OF MANUFACTURING A LADDER FILTER

(75) Inventors: Shinji Taniguchi, Kawasaki (JP); Tokihiro Nishihara, Kawasaki (JP); Tsuyoshi Yokoyama, Kawasaki (JP); Masafumi Iwaki, Kawasaki (JP); Go Endo, Yokohama (JP); Yasuyuki Saitou, Yokohama (JP); Hisanori Ehara, Yokohama (JP); Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 1212 days.

(21) Appl. No.: 12/647,794

(22) Filed: Dec. 28, 2009

(65) Prior Publication Data

US 2010/0096358 A1  Apr. 22, 2010

Related U.S. Application Data

(62) Division of application No. 11/907,704, filed on Oct. 16, 2007, now abandoned.

(30) Foreign Application Priority Data

Oct. 17, 2006 (JP) ................. 2006-282290

(51) Int. Cl.
| | | |
|---|---|---|
| H04R 17/00 | (2006.01) | |
| H03H 9/205 | (2006.01) | |
| H03H 9/56 | (2006.01) | |
| H03H 9/64 | (2006.01) | |
| H03H 9/15 | (2006.01) | |
| H03H 9/17 | (2006.01) | |
| H03H 9/54 | (2006.01) | |
| H03H 9/60 | (2006.01) | |
| H03H 3/00 | (2006.01) | |
| H03H 3/007 | (2006.01) | |

(52) U.S. Cl.
CPC ............... *H03H 9/205* (2013.01); *H03H 9/568* (2013.01); *H03H 9/6483* (2013.01); *H03H 9/15* (2013.01); *H03H 9/178* (2013.01); *H03H 9/54* (2013.01); *H03H 9/605* (2013.01); *H03H 3/00* (2013.01); *H03H 3/0073* (2013.01)
USPC ............ 29/25.35; 29/592.1; 29/594; 29/829; 29/876; 29/885; 310/312; 310/364; 310/320; 310/340; 310/344; 333/187; 333/188; 333/189

(58) Field of Classification Search
CPC ......... H03H 3/00; H03H 3/0073; H03H 9/15; H03H 9/178; H03H 9/205; H03H 9/568; H03H 9/54; H03H 9/605; H03H 9/6483
USPC ......... 29/25.35, 829, 876, 885; 310/312, 313, 310/320, 340, 344, 348, 364; 333/133, 333/187–189, 193, 195
See application file for complete search history.

(56) References Cited

U.S. PATENT DOCUMENTS

| | | | |
|---|---|---|---|
| 5,910,756 A * | 6/1999 | Ella | ................. 333/133 |
| 6,407,649 B1 | 6/2002 | Tikka et al. | |
| 6,518,860 B2 | 2/2003 | Ella et al. | |
| 6,670,866 B2 * | 12/2003 | Ella et al. | ........................ 333/133 |
| 6,734,763 B2 | 5/2004 | Nishihara et al. | |
| 6,933,809 B2 | 8/2005 | Kyoung et al. | |
| 6,963,257 B2 * | 11/2005 | Ella et al. | ........................ 333/133 |
| 7,019,604 B2 | 3/2006 | Gotoh et al. | |
| 7,221,242 B2 | 5/2007 | Asai et al. | |
| 7,498,717 B2 * | 3/2009 | Yokoyama et al. | ............ 310/320 |
| 7,554,422 B2 * | 6/2009 | Nakatsuka et al. | ............ 333/133 |
| 7,586,391 B2 * | 9/2009 | Volatier et al. | ................. 333/188 |
| 7,701,117 B2 * | 4/2010 | Nakatsuka et al. | ............ 310/320 |
| 2002/0089393 A1 | 7/2002 | Tikka et al. | |
| 2005/0046519 A1 | 3/2005 | Yokoyama et al. | |
| 2005/0146242 A1 | 7/2005 | Inoue | |
| 2005/0152110 A1 | 7/2005 | Chen | |
| 2005/0218754 A1 | 10/2005 | Yokoyama et al. | |
| 2005/0264137 A1 | 12/2005 | Taniguchi et al. | |
| 2006/0152110 A1 | 7/2006 | Taniguchi et al. | |
| 2007/0096597 A1 | 5/2007 | Taniguchi et al. | |

FOREIGN PATENT DOCUMENTS

| | | |
|---|---|---|
| EP | 1583233 A1 | 10/2005 |
| EP | 1653612 A2 | 5/2006 |
| EP | 1684424 A1 | 7/2006 |
| JP | 2002-268644 A | 9/2002 |
| JP | 2005286945 A | 10/2005 |
| JP | 2006-020277 A | 1/2006 |
| JP | 2006128993 A | 5/2006 |
| KR | 2006-0082413 A | 7/2006 |

OTHER PUBLICATIONS

Lakin, K.M., "Thin Film Resonator Technology", 2003 IEEE International Frequency Control Symposium & PDA Exhibition jointly with the 17th European Frequency and Time Forum, May 4, 2003, pp. 765-778.

Schmidhammer, E., et al., "Design Flow and Methodology on the Design of BAW Components," IEEE Microwave Symposium Digest, Jun. 12, 2005, pp. 233-236.

Park, Y.U. et al., "Comparison of Micromachined FAR Band pass Filters with Different Structural Geometry," 2003 IEEE MTT-S International Microwave Symposium Digest, Jun. 8-13, 2003, pp. 2005-2005, vol. 3.

Japanese Office Action in a counterpart Japanese patent application No. 2006-282290, dated May 10, 2011, citing Foreign Patent document No. 1 listed above and JP2005-286945, which has been submitted in a previous IDS.

* cited by examiner

*Primary Examiner* — Paul D Kim

(74) *Attorney, Agent, or Firm* — Chen Yoshimura LLP

(57) ABSTRACT

A method of manufacturing a ladder filter including first and second resonators includes: forming a piezoelectric film on an entire surface of a substrate that has respective lower electrodes of the first and second resonator formed thereon, an conductive film on the piezoelectric film, and a second film on the conductive film; forming a pattern of the second film in a prescribed region in the second area; forming a first film on an entire surface of the substrate; etching the first film, forming a pattern of the first film, the second film and the conductive film in the second area, and forming a pattern of the first film and the conductive film in the first area, to form respective upper electrodes from the conductor film; and thereafter, etching the piezoelectric film to form respective patterns of the piezoelectric film in the first and second areas, respectively.

14 Claims, 12 Drawing Sheets

PARALLEL RESONATOR

SERIES RESONATOR

PARALLEL RESONATOR

SERIES RESONATOR

1ST COMPARATIVE EXAMPLE

1ST EMBODIMENT

Fig. 10A  1ST COMPARATIVE EXAMPLE
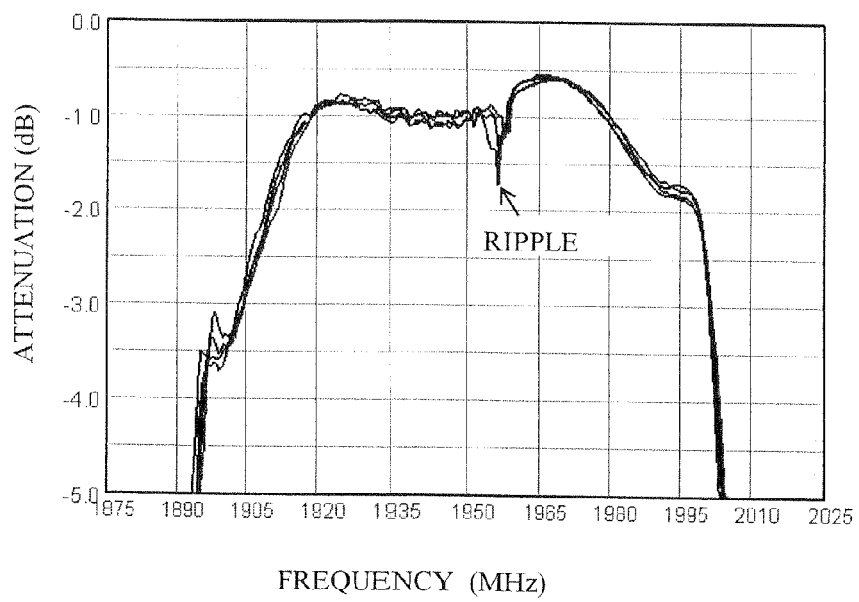
Fig. 10B
1ST EMBODIMENT
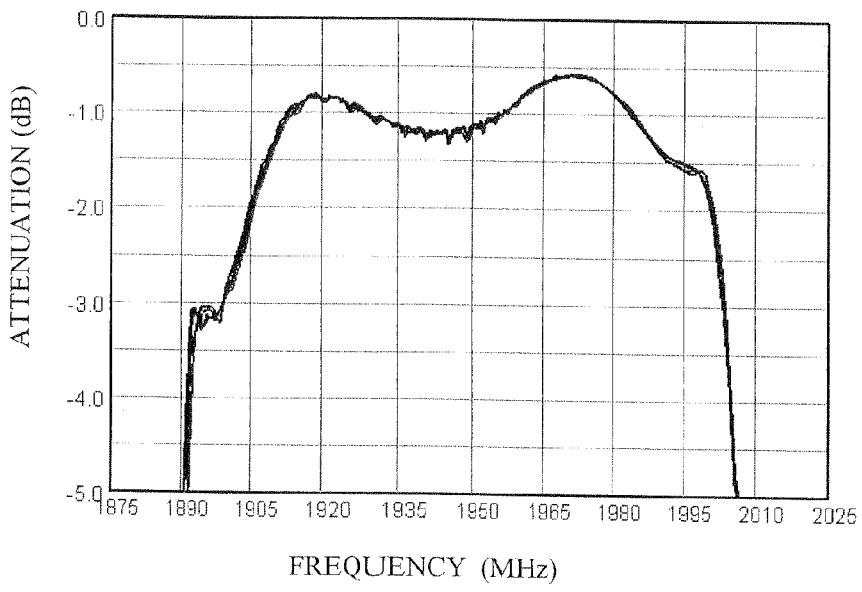

METHOD OF MANUFACTURING A LADDER FILTER

CROSS-REFERENCE TO RELATED APPLICATIONS

This is a divisional application, which claims the benefit of U.S. patent application Ser. No. 11/907,704, filed in Oct. 16, 2007, now abandoned which claims the benefit of Japanese Patent Application No. 2006-282290, filed Oct. 17, 2006. The disclosures of the prior applications are hereby incorporated herein in their entirety by reference.

BACKGROUND OF THE INVENTION

1. Field of the Invention

The present invention relates to ladder type filters, and more particularly, to a ladder type filter using a piezoelectric thin-film resonator.

2. Description of the Related Art

There has been an increasing demand for compact and lightweight resonators and filters using such resonators due to rapid spreading of wireless equipment such as cellular phones. In the past, dielectric filters and surface acoustic wave (SAW) filters were used. Recently, there has been a considerable activity in the research and development of a piezoelectric thin-film resonator and a filter using such a resonator.

The piezoelectric thin-film resonators may be categorized into an FBAR (Film Bulk Acoustic Resonator) type and an SMR (Solidly Mounted Resonator) type. The FBAR has a primary structure composed of an upper electrode, a piezoelectric film and a lower electrode, and a hollow space provided below the lower electrode and located within an overlapping region (resonance portion) in which the upper and lower electrodes overlap with each other across the piezoelectric film. The hollow space may be defined between the lower electrode and a silicon substrate by wet-etching a sacrificed layer on a main surface of the silicon substrate. The hollow space may also be formed by wet- or dry-etching the substrate from the backside thereof. The SMR employs an acoustic reflection film instead of the hollow space, in which a first film having a relatively high acoustic impedance and a second film having a relative low acoustic impedance are alternately laminated with a film thickness of $\lambda/4$ where $\lambda$ is the wavelength of an acoustic wave of the resonator.

The upper and lower electrodes may be made of aluminum (Al), copper (Cu), molybdenum (Mo), tungsten (W), tantalum (Ta), platinum (Pt), ruthenium (Ru), rhodium (Rh), iridium (Ir) or the like. The piezoelectric thin film may be made of aluminum nitride (AlN), zinc oxide (ZnO), lead zirconium titanate (PZT), lead titanate ($PbTiO_3$) or the like. The substrate may be made of glass other than silicon.

The operation principles of the piezoelectric thin-film resonators will now be described. The following description is exemplarily directed to the FBAR. A voltage of a high frequency is applied between the upper electrode and the lower electrode. An acoustic wave resulting from the inverse piezoelectric effect is excited within the piezoelectric film in the resonance portion. A distortion of the piezoelectric film caused by the acoustic wave is converted into an electric signal developing between the upper electrode and the lower electrode due to the piezoelectric effect. The acoustic wave is reflected by an interface between the air and the upper electrode and another interface between the air and the lower electrode. Thus, the vertical vibration having major displacement is caused in the thickness direction of the piezoelectric film. The resonant phenomenon of the vertical vibration is utilized to form a resonator having a desired frequency response and a filter using such a resonator.

The resonance phenomenon is specifically caused at a frequency at which the total thickness H of the lower electrode, the piezoelectric film and the upper electrode (including a film added to the upper electrode) is equal to an integer multiple (n times) of half the wavelength $\lambda$ ($\lambda/2$) of the acoustic wave excited. That is, the resonance phenomenon is caused at the frequency at which $H=n\lambda/2$. Assuming that V denotes the propagation velocity of the acoustic wave that depends on the material used to form the piezoelectric film, the resonance frequency F is equal to $nV/(2H)$. This shows that the resonance frequency F can be controlled by the total thickness H of the film laminate.

A ladder filter is a typical example of the piezoelectric thin-film resonator. The ladder filter is composed of series resonators arranged between an input terminal and an output terminal and parallel resonators, and functions as a bandpass filter. FIG. 1A shows an equivalent circuit of a series resonator S, and FIG. 1B shows an equivalent circuit of a parallel resonator P. FIG. 1C shows transmission characteristics of the series resonator S and the parallel resonator P. The series resonator S has a maximum value at a resonance frequency frs and a minimum value at an anti-resonance frequency fas. The parallel resonator P has a minimum value at a resonance frequency frp and a maximum value at an anti-resonance frequency fap. FIG. 2A shows an equivalent circuit of a ladder filter composed of a single stage formed by one series resonator S and one parallel resonator P. FIG. 2B shows a bandpass characteristic of the ladder filter shown in FIG. 2A. The bandpass filter can be configured by setting the resonance frequency frs of the series resonator S and the anti-resonance frequency fap of the parallel resonator P approximately equal to each other. The anti-resonance frequency fas of the series resonator S corresponds to the frequency of an attenuation pole on the high-frequency side of the pass band, and the resonance frequency frp of the parallel resonator P corresponds to the frequency of an attenuation pole on the low-frequency side.

In order to obtain a desired pass band of the ladder filter, it is required that the resonance frequencies of the series resonator S and the parallel resonator P are designed to have a slight difference (normally, a few %). In a case where the series resonator S and the parallel resonator P are formed on an identical substrate, a frequency adjustment step ($\Delta f$ adjustment step) is needed to make the series resonator S and the parallel resonator P. The center frequency of the pass band can be adjusted by adjusting the resonance frequencies of both the series resonator S and the parallel resonator P ($f_0$ adjustment step).

Japanese Patent Application Publication No. 2005-286945 discloses a technique in which a first adjustment film and a second adjustment film are stacked on an upper electrode as a frequency adjustment film, and the first adjustment films on the series resonator S and the parallel resonator P are made different from each other in thickness. The $\Delta f$ adjustment step is implemented by setting the first adjustment films on the series resonator S and the parallel resonator P different from each other in thickness, and the $f_0$ frequency adjustment is implemented by adjusting the thickness of the second adjustment film of each of the series resonator S and the parallel resonator P. Thus, the $\Delta f$ adjustment step and the $f_0$ adjustment step can be performed separately.

Japanese Patent Application Publication No. 2006-128993 discloses that an edge of a piezoelectric film is located further in than an edge of a region in which the upper and lower electrodes overlap with each other. With this structure, it is possible to prevent the acoustic wave from leaking outwards from the resonance portion. This is called lateral leakage of acoustic wave. The structure may be formed by wet etching the piezoelectric film.

As has been described, the technique disclosed in Japanese Patent Application Publication No. 2005-286945 employs the Δf adjustment step of causing the first adjustment films of the series resonator and the parallel resonator to have different thickness values. For example, the first adjustment film of the series resonator is etched and thinned. However, it is very difficult to reliably stop etching when the first adjustment film has been etched halfway. It is thus very difficult to reliably set the difference between the resonance frequency of the series resonator and that of the parallel resonator.

SUMMARY OF THE INVENTION

The present invention has been made in view of the above circumstances and provides a ladder filter capable of reliably setting the difference between the resonance frequency of the series resonator and that of the parallel resonator.

According to an aspect of the present invention, there is provided a ladder filter including: a series resonator having a first film laminate in which an upper electrode and a lower electrode face each other across a piezoelectric film, and a first film provided on the first film laminate; and a parallel resonator having a second film laminate having a structure similar to that of the first film laminate, a second film provided on the second film laminate, and another first film identical to the first film.

BRIEF DESCRIPTION OF THE DRAWINGS

Preferred embodiments of the present invention will now be described with reference to the accompanying figures, in which:

FIG. 10A is a graph of a bandpass characteristic of the first comparative example;

FIG. 10B is a graph of a bandpass characteristic of the first embodiment;

DESCRIPTION OF THE PREFERRED EMBODIMENTS

A description will now be given of preferred embodiments of the present invention.

First Embodiment

Figure 3:
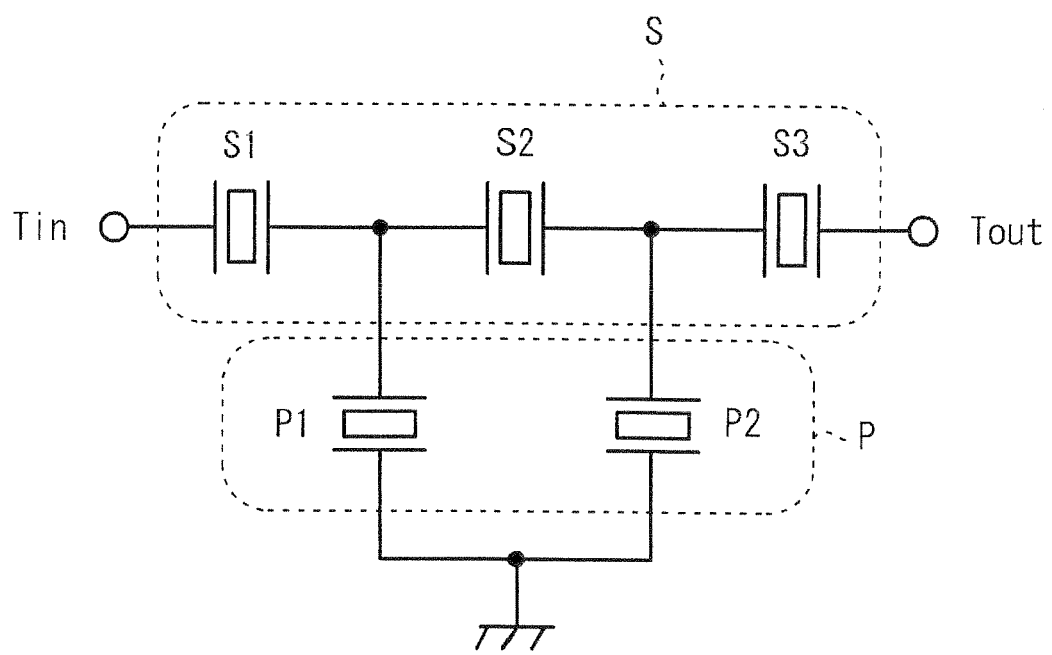
FIG. 3 is an equivalent circuit diagram of a ladder filter in accordance with a first embodiment of the present invention.

FIG. 3 is a circuit diagram of a ladder filter in accordance with a first embodiment of the present invention. Series resonators S1, S2 and S3 are connected in series between an input terminal Tin and an output terminal Tout. A parallel resonator P1 is connected to a node between the series resonators S1 and S2 and ground. A parallel resonator P2 is connected to a node between the series resonators S2 and S3 and ground. The series resonators S (S denotes any of S1 through S3) and the parallel resonators P (P denotes any of P1 and P2) have different structures, as will be described later.

Figure 4A:
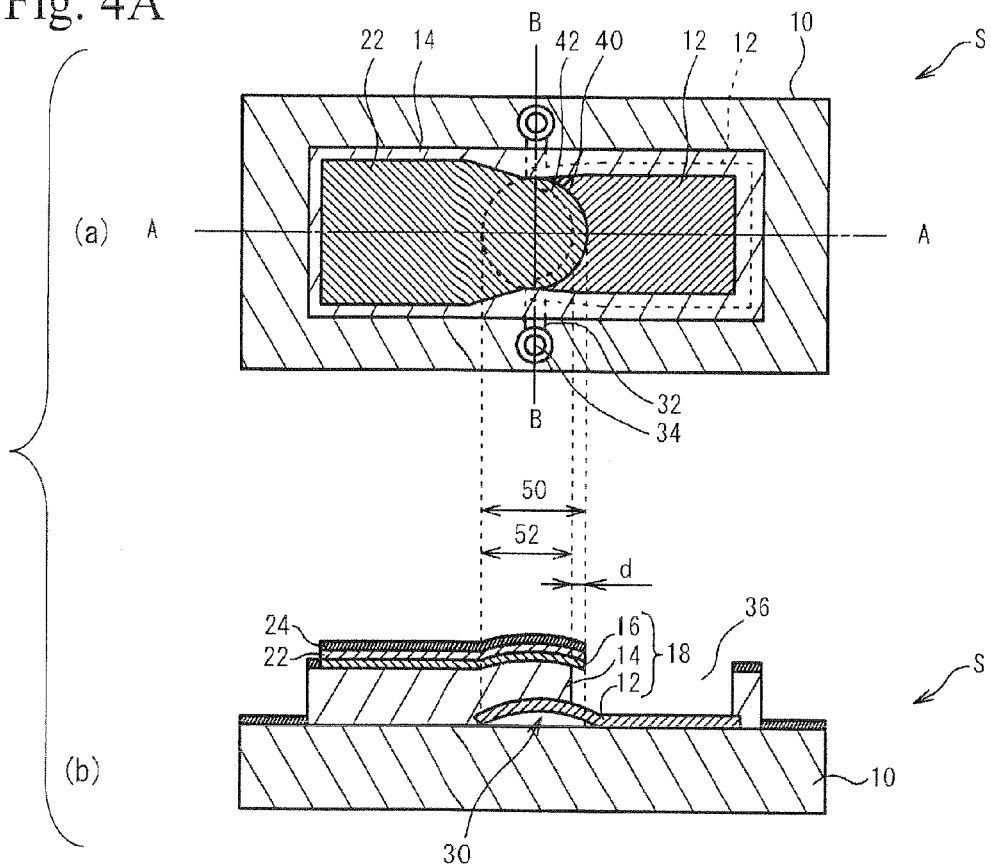
FIG. 4A is composed of a part (a) that shows a plan view of a series resonator employed in the first embodiment, and a part (b) that shows a cross-sectional view taken along a line A-A in part (a)

The structure of the series resonators S will be described below. A part (a) of FIG. 4A shows a plan view of the series resonator S, and a part (b) shows a cross-sectional view taken along a line A-A shown in part (a). A lower electrode 12 is provided on a silicon substrate 10 so as to form a hollow space 30 that is formed between the silicon substrate 10 and the lower electrode 12 and is oriented upwards. The hollow space 30 is be defined by a raised portion of the lower electrode 12 having a dome shape. Thus, the hollow space 30 may be referred to as a dome-shaped hollow space. The dome-shaped portion of the lower electrode 12 may have a gradually increasing height towards the center of the hollow space 30 from its periphery. The lower electrode 12 may have Ru/Cr (ruthenium/chromium) structure. A piezoelectric film 14 that may be made of, for example, aluminum nitride (AlN) and has the main axis in the (002) direction, is provided on the lower electrode 12. An upper electrode 16 is provided on the piezoelectric film 14 so that an overlapping region (resonance portion 52) can be defined in which the upper electrode 16 overlaps with the lower electrode 12 across the piezoelectric film 14. The upper electrode 16 may be made, for example, Ru. The lower electrode 12, the piezoelectric film 14 and the upper electrode 16 form a film laminate 18. A first film 22 made of Cr is provided on the upper electrode 16. A third film 24, which may be made of, for example, silicon oxide ($SiO_2$), is provided on the first film 22, the substrate 10 and the piezoelectric film 14.

A guide path 32 for etching a sacrificed layer, which will be described later, is provided in the lower electrode 12 so as to run in a direction B-B. An end of the guide path 32 is not covered with the piezoelectric film 14, and apertures 34 are formed in the lower electrode 12 and are connected to the ends of the guide path 32. An opening 36 is provided in the piezoelectric film 14 for making an electric connection with the lower electrode 12. In the opening 36, at least a part of an outer curved edge 42 of the piezoelectric film 14 is further in, by a distance "d", than an outer curved edge of a region 50 in which the upper electrode 16 overlaps with the lower electrode 12 across the piezoelectric film 14.

Figure 4B:
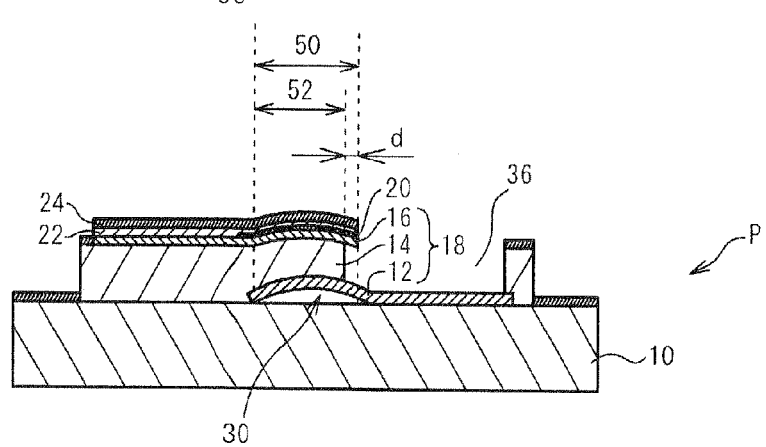
FIG. 4B is a cross-sectional view of a parallel resonator taken along line A-A.

The parallel resonator P will now be described with reference to FIG. 4B, which shows a cross-sectional view taken along the line A-A of the parallel resonator P. The parallel resonator P differs from the above-mentioned series resonator S in that a second film 20 made of, for example, titanium (Ti), is provided between the upper electrode 16 and the first film 22. The other structures of the parallel resonator P are the same as those of the series resonator S.

Figure 1A:
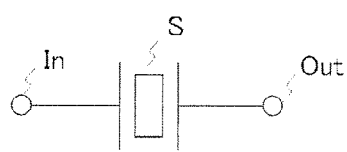
FIG. 1A is an equivalent circuit diagram of a series resonator.
Figure 1B:
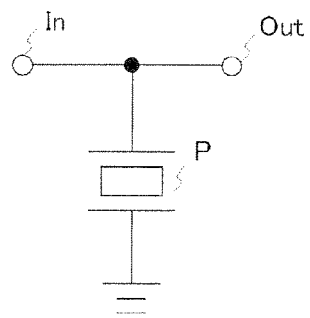
FIG. 1B is an equivalent circuit diagram of a parallel resonator.
Figure 1C:
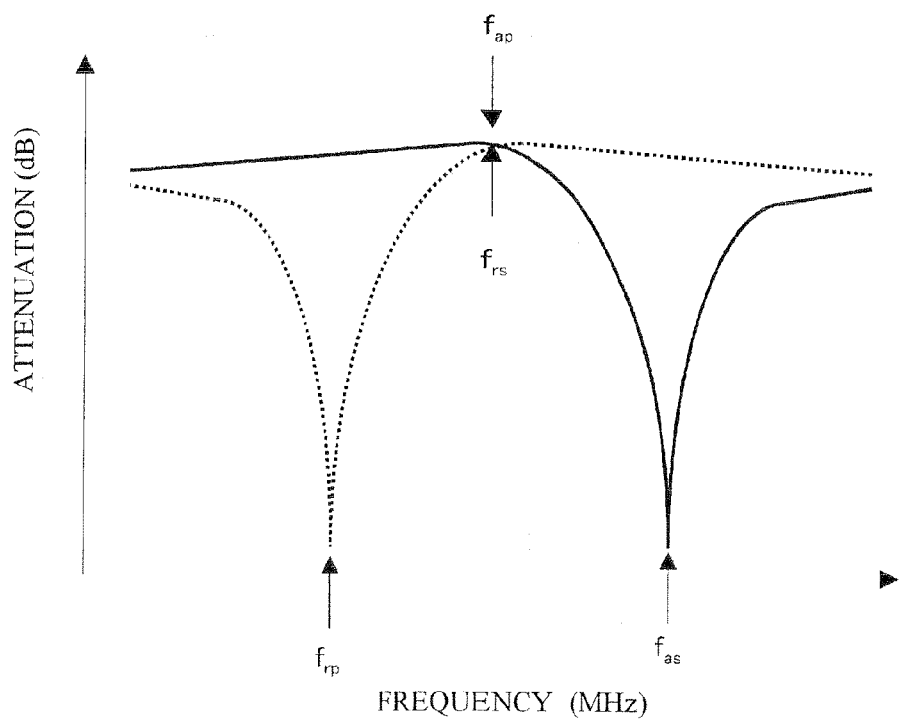
FIG. 1C is a graph of frequency characteristics of the series resonator and the parallel resonator.
Figure 2A:
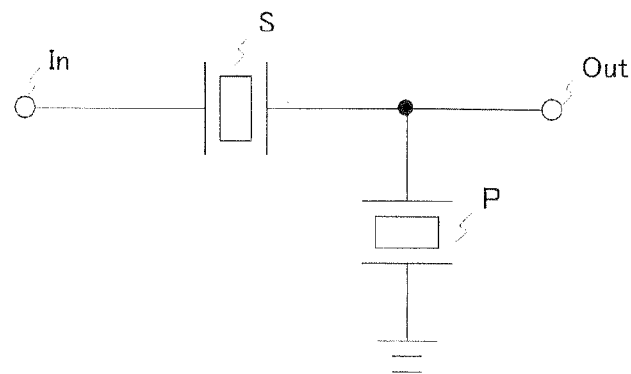
FIG. 2A is an equivalent circuit diagram of a ladder filter of a single stage.
Figure 2B:
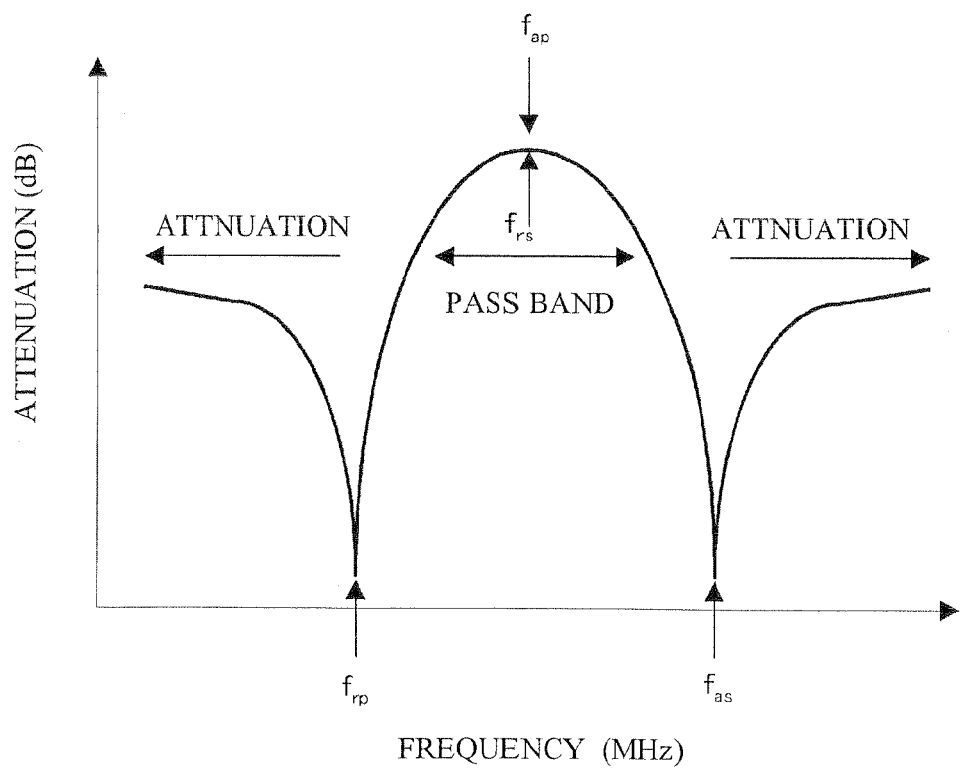
FIG. 2B is a bandpass characteristic of the ladder filter.

The laminate that contributes the resonance frequency of the resonance portion 52 of the series resonator S is, from the top, $SiO_2$/Cr/Ru/AlN/Ru/Cr. In contrast, the laminate that contributes the resonance frequency of the resonance portion 52 of the parallel resonator P is, from the top, $SiO_2$/Cr/Ti/Ru/AlN/Ru/Cr. The parallel resonator P is provided with the second film made of Ti, and can be designed to have a different resonance frequency from that of the series resonator S. Thus, a response of the bandpass filter a shown in FIG. 2B can be obtained.

Figure 5A:
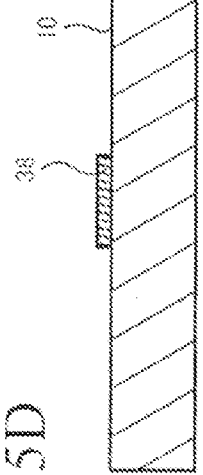
FIGS. 5A through 5F are cross-sectional views of a method for manufacturing the series and parallel resonators.
Figure 5B:
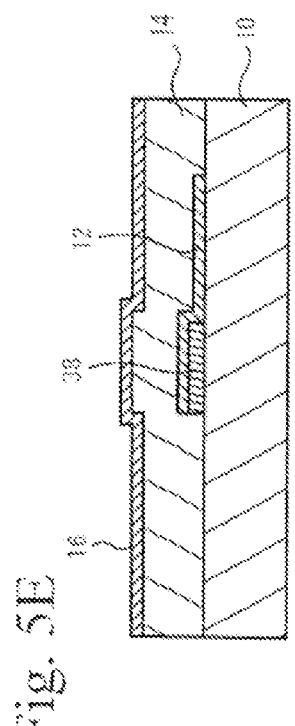

A description will now given of a method for manufacturing the series resonator S and the parallel resonator P. Referring to FIGS. 5A and 5D, a sacrificed layer 38 made of MgO (magnesium oxide) is deposited on the silicon substrate 10 by sputtering so as to have a thickness of approximately 40 nm. Next, the sacrificed layer 38 is formed into a given shape by lithography and etching. Referring to FIGS. 5B and 5E, the next step is to deposit a Cr film having a thickness of approximately 100 nm and a Ru film having a thickness of approximately 250 nm by sputtering. Then, the film laminate is shaped into the lower electrode 12 by the lithography and etching. Thereafter, AlN for the piezoelectric film 14 is deposited to a thickness of 1150 nm on the lower electrode 12 and the substrate 10 by sputtering. Then, a Ru film having a thickness of 250 nm for the upper electrode 16 is formed on the piezoelectric film 14 by sputtering.

Figure 5C:
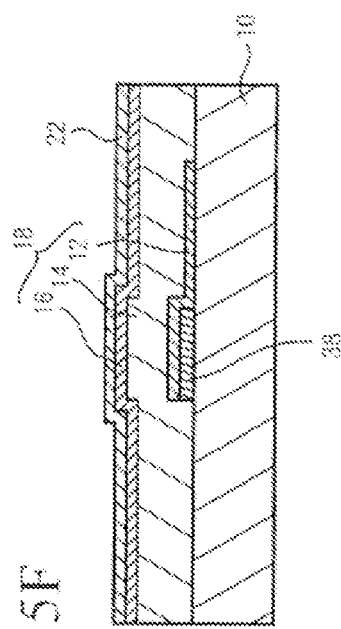
Figure 5D:
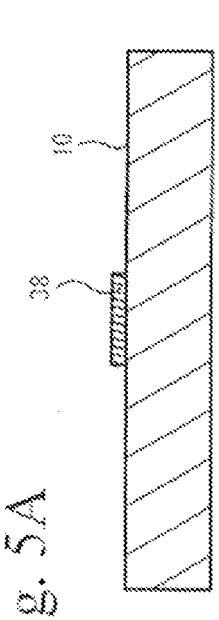
Figure 5E:
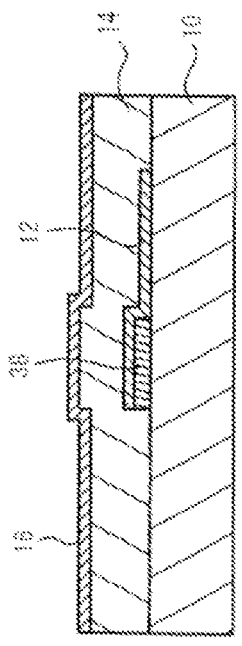
Figure 5F:
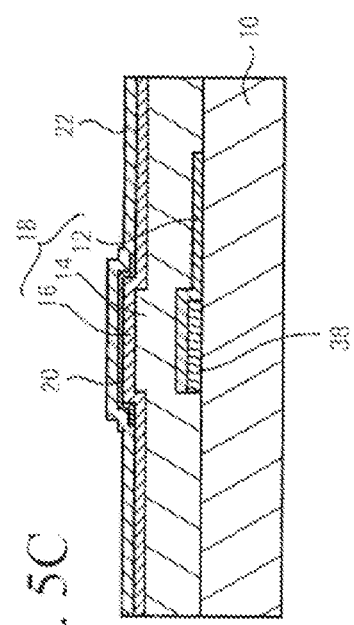
Figure 7A:
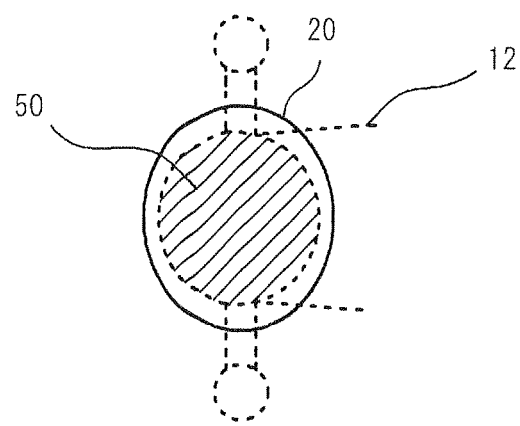
FIGS. 7A, 7B and 7C are plan view of a region 50 and its vicinity.

Referring to FIGS. 5C and 5F, a Ti film having a thickness of 115 nm for the second film 20 is formed by sputtering so as to cover the upper electrode 16. Then, using lithography and etching, the second film 20 is etched so that it remains on the sacrificed layer 38 of the parallel resonator P and does not remain thereon in the series resonator S. In this etching, the Ti film and the Ru film are etched with a selectivity, so that the second film 20 can be etched without losing the thickness of the upper electrode 16. FIG. 7A shows a positional relationship between the upper electrode 16, the second film 20 and a region (which will become the region 50 and will be referred to as region 50 for the convenience' sake) in the parallel resonator P. The second film 20 is formed so as to include the region 50. Referring to FIGS. 5C and 5F, a Cr film having a thickness of approximately 20 nm for the first film 22 is deposited on the upper electrode 16 and the second film 20 by sputtering.

Figure 6A:
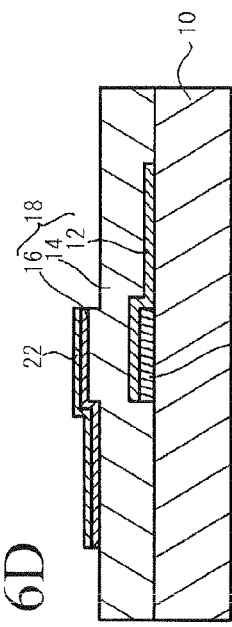
FIGS. 6A through 6F are cross-sectional views of a subsequent process of the method.
Figure 6B:
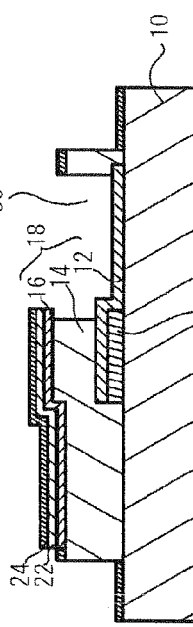
Figure 6C:
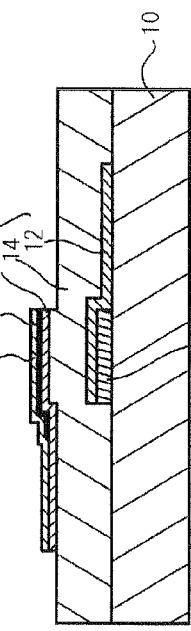
Figure 6D:
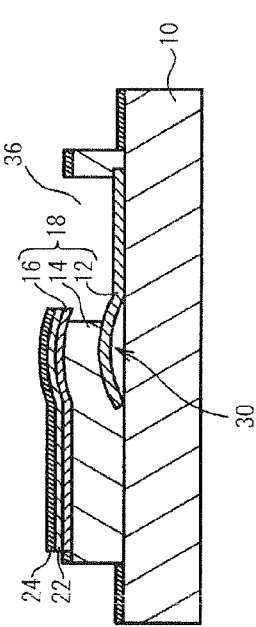
Figure 7B:
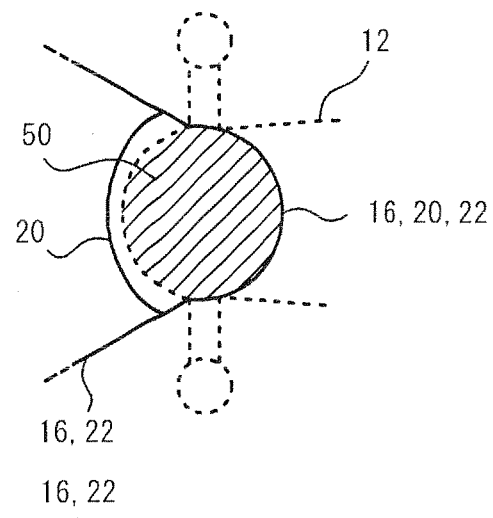

Referring to FIGS. 6A and 6D, the first film 22 is formed into a given shape by lithography and etching. FIG. 7B shows a positional relationship between the upper electrode 16, the second film 20, the first film 22 and the region 50 in the parallel resonator P. When the first film 22 is etched, the second film 20 is etched. Thus, the outer curved edges of the upper electrode 16, the first film 22 and the second film 20 are aligned with each other on the right side of the region 50. In contrast, the second film 20 is greater than the region 50 on the left side of the region 50. The outer curved edges of the upper electrode 16 and the first film 22 are aligned with each other.

Figure 6E:
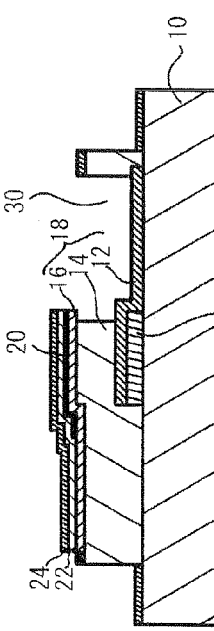
Figure 7C:
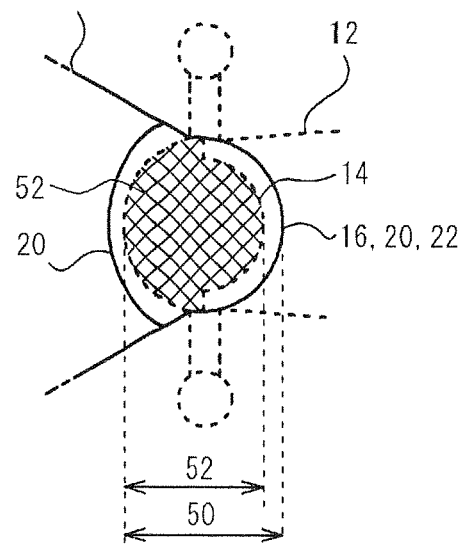

Referring to FIGS. 6B and 6E, the piezoelectric film 14 is etched by lithography and etching. This etching may be wet etching using a phosphoric acid. The piezoelectric film 14 is over-etched, so that the outer curved edge of the piezoelectric film 14 can be further in than the region 50. After the piezoelectric film 14 of AlN is etched, the third film 24 made of $SiO_2$ is formed on the first film 22, the substrate 10 and the piezoelectric film 14. FIG. 7C shows a positional relationship between the lower electrode 12, the upper electrode 16, the second film 20, the first film 22 and the region 50 in the parallel resonator P. The outer curved edge of the piezoelectric film 14 is further in than the region 50 on the right side of the region 50. Thus, the outer curved edge of the resonance portion 52 is further in than the outer edge of the region 50 on the right side of the region 50. In contrast, the outer curved edge of the resonance portion 52 coincides with the outer curved edge of the region 50 on the left side of the region 50.

Figure 6F:
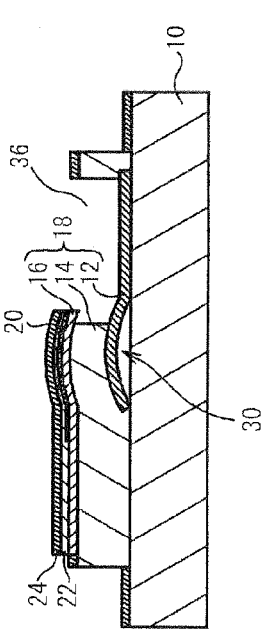

Referring to FIGS. 6C and 6F, etchant for etching the sacrificed layer 38 is applied to the guide path 32 (see FIG. 4A) through the apertures 34, and the sacrificed layer 38 is removed. The stress of the film laminate 18 composed of the lower electrode 12, the piezoelectric film 14 and the upper electrode 16 is set so as to be compressive stress by adjusting the sputtering conditions for the respective films. Thus, when etching of the sacrificed layer 38 is finished, the film laminate is raised so that the dome-shaped hollow space 30 oriented towards the film laminate 18 can be formed between the lower electrode 12 and the substrate 10. The compressive stress may be set in the range of −150 MPa to −300 MPa. Through the above process, the series resonator S and the parallel resonator P can be completed.

Figure 8:
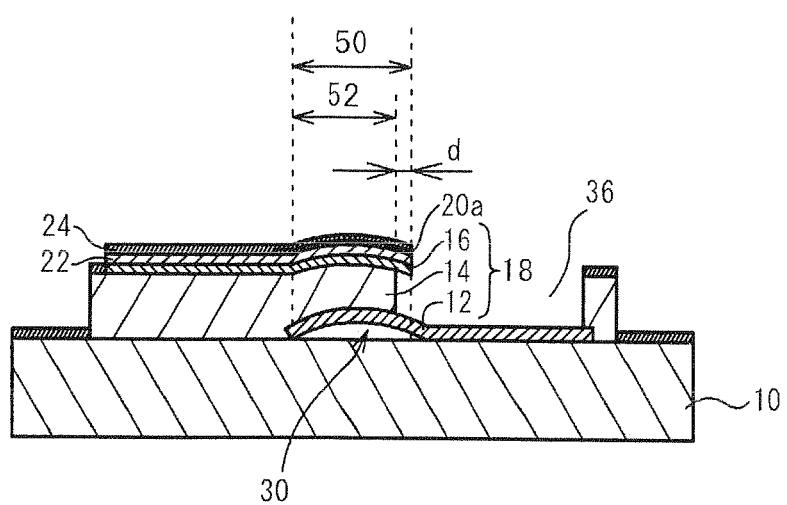
FIG. 8 is a cross-sectional view of a parallel resonator in accordance with a first comparative example.

The first embodiment and a first comparative example are compared with each other. FIG. 8 is a cross-sectional view of a ladder filter in accordance with the first comparative example. As compared to FIG. 4B, a second film 20a of the first comparative example is provided between the first film 22 and the third film 24. The first comparative example may be fabricated by forming the second film 20 and the first film in the reverse sequence in FIGS. 5C and 5F. That is, in FIGS. 6B and 6E, when the piezoelectric film 14 is etched, the second film 20 is merely protected by photoresist.

Figure 9A:
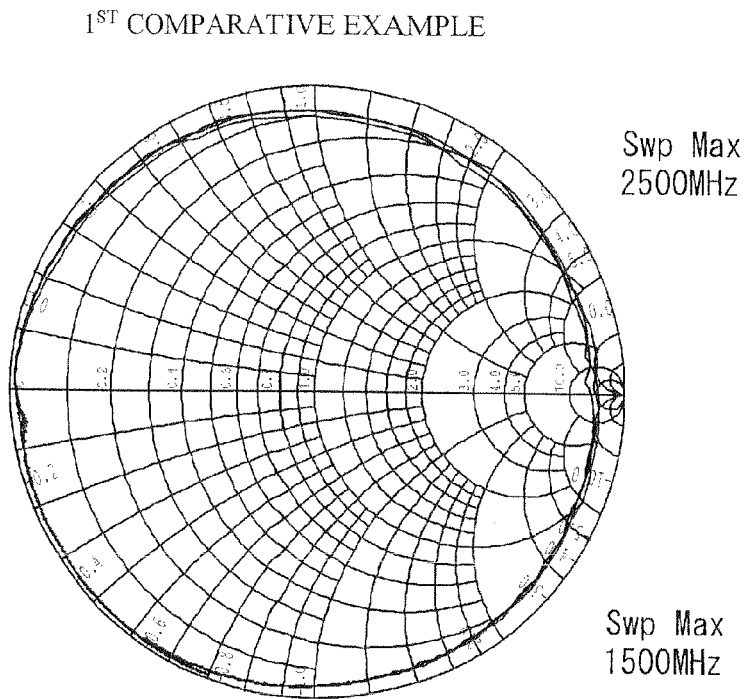
FIG. 9A is a Smith chart of characteristics of resonators of the first comparative example.
Figure 9B:
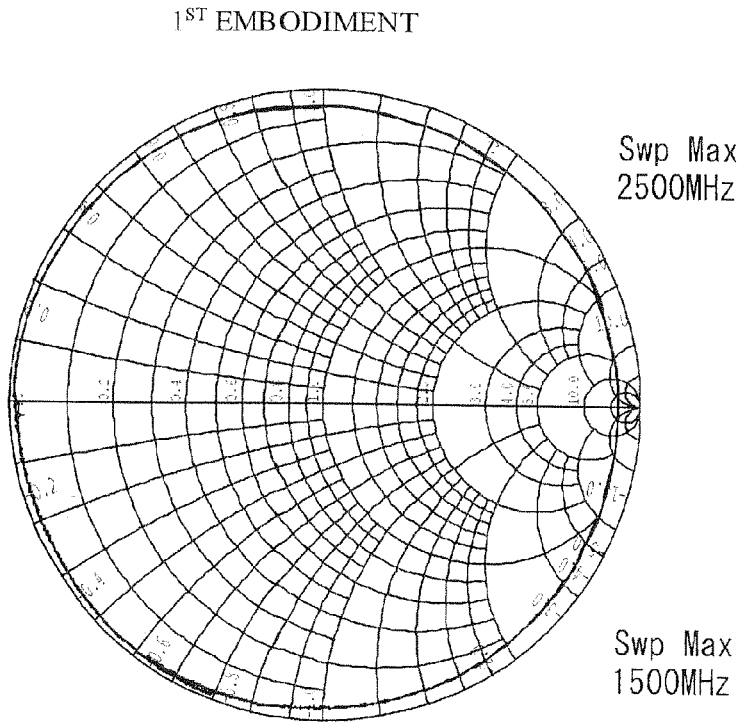
FIG. 9B is a Smith chart of characteristics of resonators of the first embodiment.

FIGS. 9A and 9B are Smith charts of the first comparative example and the first embodiment, respectively, in which the S11 characteristics of three parallel resonators in a wafer are shown. The resonators used for measurement have an oval shape of the resonance portion 50 having a major axis of 247 μm and a minor axis of 176 μm. The distance "d" in FIG. 4B is selected so that lateral leakage of acoustic wave can be restrained. The three resonators of the first embodiment have almost the same the S11 characteristics. In contrast, the three resonators of the first comparative example have different S11 characteristics.

FIGS. 10A and 10B show bandpass characteristics of the first comparative example and the first embodiment, respectively, in each of which the bandpass characteristics of formed in a wafer are shown. The regions 50 of the parallel resonators P of the ladder filters used for measurement have an oval shape that typically has a major axis of 180 μm and a minor axis of 151 μm. The parallel resonators P in each ladder filter have respective oval shapes having slightly different sizes. The regions 50 of the series resonators S of the ladder filters used for measurement have an oval shape that typically has a major axis of 233 μm and a minor axis of 195 μm. The series resonators S in each ladder filter have respective oval shapes having slightly different sizes. The distance "d" in FIGS. 4A(b) and 4B is selected so that lateral leakage of acoustic wave can be restrained. There is no difference in the bandpass characteristic between the four filters of the first embodiment. In contrast, there are considerable differences in the bandpass characteristic between the four filters of the first comparative example. Further, a great ripple takes place in the pass band, whereas the first embodiment does not have any considerable ripple. The first embodiment is capable of realizing the ladder filters having little difference in the bandpass characteristic and having suppressed ripples.

In the series resonators S of the first embodiment, the first film 22 is provided on the film laminate 18. In the parallel resonators P of the first embodiment, the second film 20 is provided on the film laminate 18, and the first film 22 is provided on the second film 20. Thus, the presence/absence of the second film 20 defines the difference Δf between the resonance frequency of the series resonator S and that of the parallel resonator P. The first films 22 of the series resonator S and the parallel resonator P are made of an identical material. Thus, another film may be formed on the first film 22 of the series resonator S and that of the parallel resonator P with almost the same adhesiveness.

For example, referring to FIGS. 6A and 6B, films that contact resist (not shown) in the series resonator S and the parallel resonator P at the time of etching the piezoelectric film 14 are the first films 22 in the first embodiment. In contrast, in the first comparative example, the first film 22 contacts resist (not shown) in the series resonator S, and the second film 20a contacts resist (not shown) in the parallel resonator P at the time of etching the piezoelectric film 14. It is to be noted that Ti of the second film 20a is likely to be etched in wet etching and is weaker in adhesive strength to the resist than Cr of the first film 22. Thus, in the first comparative example, the second film 20a is unwillingly etched. The degree of etching of the second film 20a depends on the position on the wafer. This leads to deviations in the resonance characteristic and those in the bandpass characteristic.

Preferably, the second film 20 has a good etching selectivity to the upper electrode 16. Preferably, the first film 22 is made of a material having a strong adhesive strength to another film. This is taken into consideration in the first embodiment. That is, the first film 22 is provided on the film laminate 18 in the series resonators S, and the second film 20 is provided between the film laminate 18 and the first film 22 in the parallel resonators P. It is thus possible to prevent the thickness of the upper electrode 16 from being reduced to due to over etching at the time of forming the second film 20 and to prevent the difference Δf between the series resonator S and the parallel resonator P from deviating from the target values. It is further possible to form films on the first films 22 in the series resonator S and the parallel resonator P with an increased and identical adhesive strength.

Preferably, the first film 22 may be made of a material having good adhesiveness to another material, and the second film 20 is made of a material having a good etching selectivity to the upper electrode 16. Particularly, the first film 22 and the second film 20 are made of an electrically conductive material in order to cause these films to function as the upper electrode 16.

The third films 24 are provided on the first films 22 in the series resonators S and the parallel resonators P. The third films 24 of the series resonators S and the parallel resonators P can be simultaneously etched, so that the resonance frequencies of the series resonators S and the parallel resonators P can be simultaneously adjusted. It is thus possible to adjust the center frequency $f_0$ of the pass band. Preferably, the third film 24 is made of a material that makes it possible for the first film 22, the second film 20 and the film laminate 18 to be etched during the $f_0$ adjustment. The third film 24 also functions as a protection film for the first film 22, the second film 20 and the film laminate 18. In this viewpoint, the third film 24 is an insulation film such as a metal oxide film or a metal nitride film.

Referring to FIG. 7C, in the parallel resonator P, it is preferable that the region provided with the second film 20 includes the region 50 in which the upper electrode 16 faces the lower electrode 12 across the piezoelectric film 14. If there is a part of the region 50 in which the second film 20 is not formed, the resonance characteristic will deviate from the designed characteristic.

Preferably, the first films 22 in the series resonators S and the first films 22 in the parallel resonators P have an identical thickness. It is thus possible to adjust the frequency difference Δf by only the thickness of the second films 20 and to suppress the deviations of the characteristics.

The hollow space has a dome shape that is oriented upwards, that is, towards the film laminate 18. It is thus unnecessary to etch the substrate 10. This improves the productivity and prevents degradation of the mechanical strength of the substrate 10. Further, only a small region is needed to form the hollow space 30, and the integration can be facilitated. The miniaturized hollow space 30 prevents the reliability of the film laminate 18 from being degraded due to mechanical vibrations. Further, the miniaturized hollow space 30 makes it possible to thin the sacrificed layer 38 and to secure good orientation of the piezoelectric film 14.

The film laminate 18 composed of the lower electrode 12, the piezoelectric film 14 and the upper electrode 16 has compressive stress. It is thus possible to reliably form the dome-shaped hollow space 30. The apertures 34 connected to the hollow space 30 are formed in the lower electrode 12. The sacrificed layer 38 is etched through the apertures 34, so that the dome-shaped hollow space 30 can be defined.

The region 50 in which the upper electrode 16 faces the lower electrode 12 across the piezoelectric film 14 is included in a region formed by projecting the hollow space 30 onto the substrate 10. This allows the film laminate 18 to vibrate.

The piezoelectric film 14 may be made of aluminum nitride or zinc oxide having an orientation having the main axis in the (002) direction. It is thus possible to provide the piezoelectric thin-film resonators having good resonance characteristics.

Second Embodiment

Figure 11:
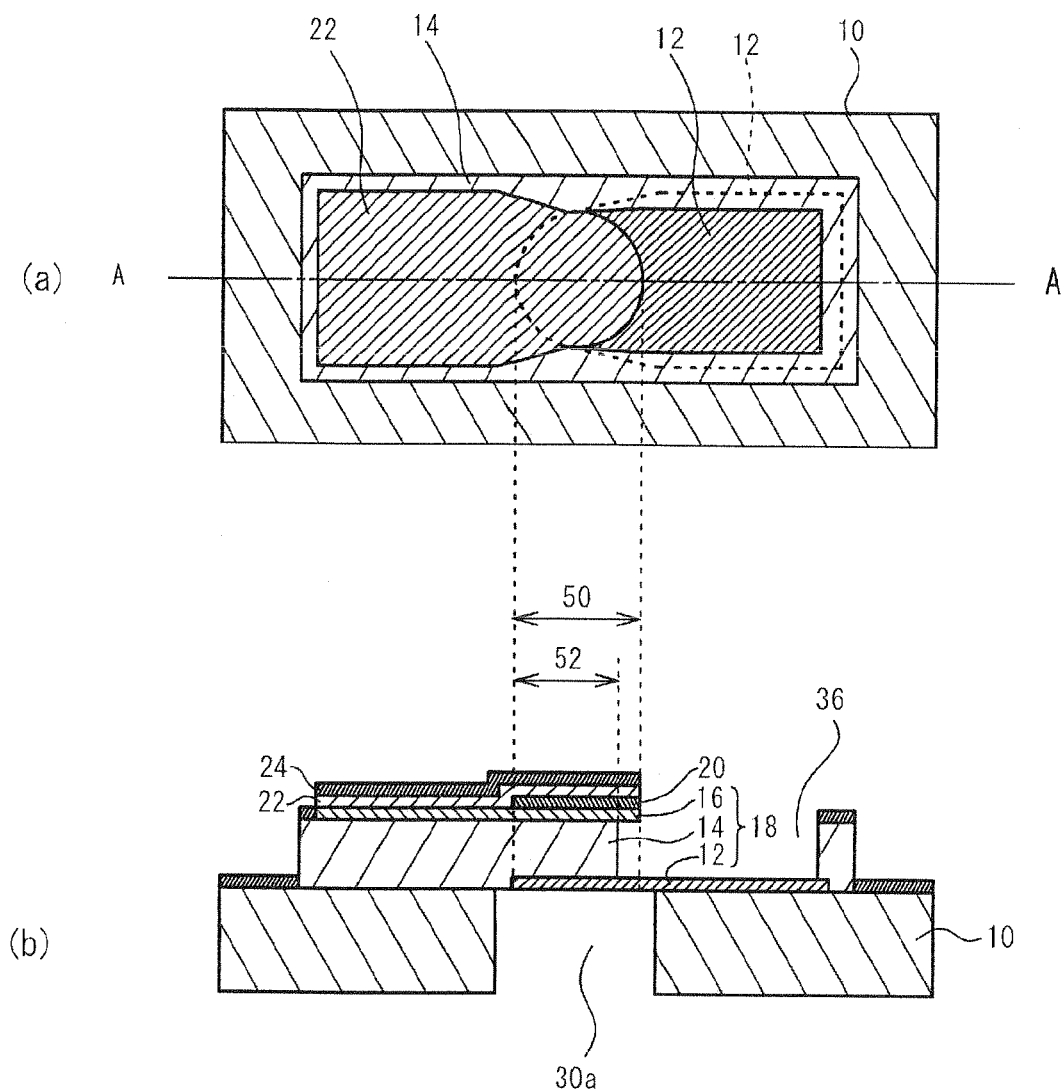
FIG. 11 is composed of a part (a) that shows a plan view of a parallel resonator in accordance with a second embodiment, and a part (b) that shows a cross-sectional view taken along a line A-A shown in part (a)

A second embodiment has a structure in which a hollow space 30a is provided in the substrate 10. A part (a) of FIG. 11 is a plan view of a resonator according to the second embodiment, and a part (b) thereof is a cross-sectional view taken along a line A-A. Referring to FIG. 11, the hollow space 30a is formed in the substrate 10 below the region 50 in which the upper electrode 16 faces the lower electrode 12 across the piezoelectric film 14. The hollow space 30a may be formed so as to have a substantially vertical wall by deep-RIE (reactive ion etching).

Third Embodiment

Figure 12:
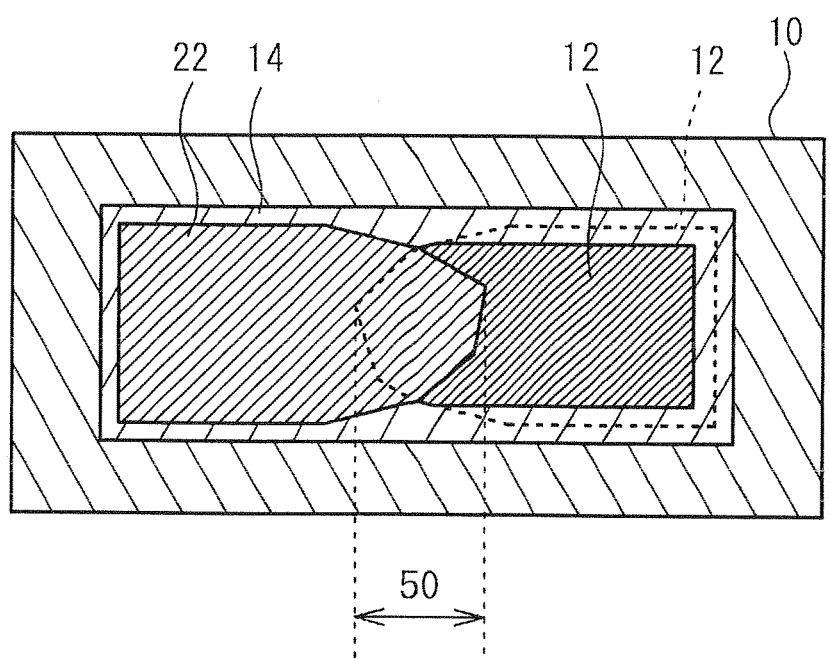
FIG. 12 is a plan view of a parallel resonator in accordance with a third embodiment.

FIG. 12 is a plan view of a series resonator S and a parallel resonator P in accordance with a third embodiment. Referring to FIG. 12, the region 50 in which the upper electrode 16 faces the lower electrode 12 across the piezoelectric film 14 has a polygonal shape composed of anti-parallel sides. The other structures of the third embodiment are the same as those of the first embodiment. The region 50 may have an oval shape in the first embodiment, or a polygonal shape composed of anti-parallel sides in the second embodiment. There are no parallel sides in the region 50. It is thus possible to prevent the acoustic wave reflected by the outer edge of the piezoelectric film 14 from being reflected and remaining in the resonance portion 52 as a standing wave in the lateral directions. It is thus possible to prevent ripples from taking place in the pass band.

The first through third embodiments are ladder filters using FBARs. The present invention includes ladder filters using SMRs. The substrate 10 may be made of quartz crystal, glass or GaAs. The lower electrode 12 and the upper electrode 16 may be made of not only Ru but also another material as described in the Description of the Related Art. Preferably, the sacrificed layer 38 may be made of a material that is easily removable by etchant. For example, the sacrificed layer 38 may be made of ZnO, Ge or Ti. The films may be formed by evaporation other than sputtering. The first film 22 is not limited to the Cr film but may be made of another material as long as similar effects are obtained. The second film 20 is not limited to the Ti film but may be made of another material as long as similar effects are obtained. The third film 24 is not limited to $SiO_2$ but may be made of another material with similar effects are obtained.

The present invention is not limited to the specifically disclosed embodiments, but other embodiments and variations may be made without departing from the scope of the present invention.

The present application is based on Japanese Patent Application No. 2006-282290 filed on Oct. 17, 2006, the entire disclosure of which is hereby incorporated by reference.

What is claimed is:

1. A method of manufacturing a ladder filter including first and second resonators, the method comprising:
    forming respective lower electrodes for the first and second resonators over a substrate in first and second areas of the substrate, respectively;
    forming a piezoelectric film on an entire surface of the substrate having the lower electrodes formed thereon;
    forming an conductive film on an entire surface of the piezoelectric film;
    forming a second film on an entire surface of the conductive film including the first and second areas;
    thereafter, forming a pattern of the second film on the conductive film having a prescribed shape that overlaps with the lower electrode for the second resonator in the second area by etching out the second film to expose a surface of the conductive film in the first and second areas other than the pattern of the second film in the second area;
    thereafter, forming a first film on an entirety of the exposed surface of the conductive film in the first and second areas and on the pattern of the second film in the second area;
    thereafter, etching the first film, the second film, and the conductive film to form a pattern of the first film, the second film and the conductive film on the piezoelectric film in the second area, and to form a pattern of the first film and the conductive film on the piezoelectric film in the first area, the conductive film thereby patterned in the second area being an upper electrode for the second resonator and overlapping with the lower electrode for the second resonator, the conductive film thereby patterned in the first area being an upper electrode for the first resonator and overlapping with the lower electrode for the first resonator; and
    thereafter, etching the piezoelectric film to form respective patterns of the piezoelectric film in the first and second areas, respectively, thereby forming the first resonator in the first area and the second resonator in the second area.

2. The method as claimed in claim 1, wherein the etching of the piezoelectric film is performed by wet etching using a phosphoric acid.

3. The method claimed in claim 2, further comprising forming a third film directly on the first film in each of the first and second areas.

4. The method as claimed in claim 1, further comprising forming a third film directly on the first film in the first and second areas that has been patterned in the step of etching the first film, the second film, and the conductive film.

5. The method as claimed in claim 4, wherein the third film is an insulation film.

6. The method as claimed in claim 1, wherein the second film in the second area patterned in the step of etching the first film, the second film, and the conductive film covers an entire region in which the upper electrode and the lower electrode overlap with each other across the piezoelectric film in the second area.

7. The method as claimed in claim 1, wherein the upper electrode comprises a ruthenium film, the first film comprises a chromium film, and the second film comprises a titanium film.

8. The method as claimed in claim 1, wherein an overlap of the upper electrode and the lower electrode having the piezoelectric film interposed therebetween has an oval shape in a plan view in each of the first and second resonators.

9. The method as claimed in claim 1, wherein an overlap of the upper electrode and the lower electrode having the piezoelectric film interposed therebetween has a polygonal shape composed of anti-parallel sides in a plan view in each of the first and second resonators.

10. The method as claimed in claim 1, wherein the lower electrode and the substrate form a hollow space therebetween in a region of the substrate where the upper electrode overlaps with the lower electrode with the piezoelectric film interposed therebetween in each of the first and second resonators.

11. The method as claimed in claim 10, wherein the hollow space has a dome shape.

12. The method as claimed in claim 11, wherein a film laminate composed of the lower electrode, the piezoelectric film, and the upper electrode has compressive stress in each of the first and second resonators.

13. The method as claimed in claim 10, wherein in a plan view, the hollow space is larger than and includes therein a region of the substrate where the upper electrode overlaps with the lower electrode with the piezoelectric film interposed therebetween.

14. The method claimed in claim 1, wherein the piezoelectric film is made of aluminum nitride or zinc oxide having an orientation having a main axis in a (002) crystal orientation of aluminum nitride or zinc oxide.

* * * * *